United States Patent
Paffrath et al.

(10) Patent No.: US 9,291,660 B2
(45) Date of Patent: Mar. 22, 2016

(54) METHOD AND APPARATUS FOR MEASURING ALPHA PARTICLE INDUCED SOFT ERRORS IN SEMICONDUCTOR DEVICES

(71) Applicant: GLOBALFOUNDRIES Inc., Grand Cayman (KY)

(72) Inventors: Elief Paffrath, Dresden (DE); Frank Schreiter, Kesselsdorf (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 560 days.

(21) Appl. No.: 13/746,699

(22) Filed: Jan. 22, 2013

(65) Prior Publication Data

US 2014/0203814 A1  Jul. 24, 2014

(51) Int. Cl.
*G01R 31/00* (2006.01)
*G01R 31/3181* (2006.01)
*G01R 31/28* (2006.01)
*G11C 11/412* (2006.01)
*G11C 29/50* (2006.01)

(52) U.S. Cl.
CPC .......... *G01R 31/002* (2013.01); *G01R 31/2881* (2013.01); *G01R 31/31816* (2013.01); *G11C 11/4125* (2013.01); *G11C 29/50* (2013.01); *G11C 29/50016* (2013.01); *G11C 2029/5002* (2013.01)

(58) Field of Classification Search
CPC .......... G01R 31/002; G01R 31/31816; G01R 31/2881; G11C 11/4125; G11C 29/50; G11C 29/50016; G11C 2029/5002
USPC ........................................................ 324/501
See application file for complete search history.

(56) References Cited

U.S. PATENT DOCUMENTS

| 2005/0211890 | A1 | 9/2005 | Ibe et al. |
| 2006/0084247 | A1* | 4/2006 | Liu ............................... 438/510 |
| 2010/0001738 | A1* | 1/2010 | Chang et al. .................. 324/501 |
| 2011/0099440 | A1 | 4/2011 | Mims et al. |

FOREIGN PATENT DOCUMENTS

TW  200532223 A  10/2005

OTHER PUBLICATIONS

Weeden, Probe Card Tutorial, available at least by Mar. 30, 2012 at http://www.keithley.jp/data?asset=13263.*
JEDEC Standard, Test Method for Alpha Source Accelerated Soft Error Rate, JESD89-2A, 2007.*

(Continued)

*Primary Examiner* — Daniel Miller
(74) *Attorney, Agent, or Firm* — Amerson Law Firm, PLLC

(57) ABSTRACT

An apparatus includes a probe card, an alpha particle source and a shutter. The probe card includes a plurality of contact elements. The contact elements define a measuring position. The shutter is arranged between the alpha particle source and the measuring position. The shutter is movable between a closed position and an open position. When the shutter is in the open position, alpha particles from the alpha particle source reach the measuring position. When the shutter is in the closed position, the alpha particles are blocked from reaching the measuring position.

20 Claims, 4 Drawing Sheets

(56) References Cited

OTHER PUBLICATIONS

JEDEC Standard, Measurement and Reporting of Alpha Particle and Terrestrial Cosmic Ray-Induced Soft Errors in Semiconductor Devices, JESD89A, JEDEC Solid State Technology Association, Oct. 2006.

Translation of Official Action from Taiwanese Application No. 102136164 dated Aug. 25, 2015.

* cited by examiner

METHOD AND APPARATUS FOR MEASURING ALPHA PARTICLE INDUCED SOFT ERRORS IN SEMICONDUCTOR DEVICES

BACKGROUND OF THE INVENTION

1. Field of the Invention

Generally, the present disclosure relates to the field of testing of integrated circuits, and, in particular, to measurements of alpha particle induced soft errors in semiconductor devices.

2. Description of the Related Art

The operation of integrated circuits such as, for example, memory circuits, logic circuits, field programmable gate arrays (FPGAs) and microprocessors, can be adversely affected by energetic particles from cosmic radiation or radioactive decay. In particular, energetic particle radiation can induce soft errors, which are non-destructive functional errors induced by the energetic particles. Energetic particle radiation can create charge carriers such as electrons and/or holes in a semiconductor material, such as silicon, which can change the logical state of circuit elements of an integrated circuit. For example, in the case of a memory cell, an impact of an energetic particle can change the data stored in the memory cell from a logical zero to a logical one, or from a logical one to a logical zero.

Energetic particles inducing soft errors in integrated circuits include, in particular, alpha particles emitted from radioactive impurities in materials nearby the sensitive volume of an integrated circuit, such as materials of packaging and/or solder bumps. Additionally, soft errors can be caused by particles from cosmic radiation or secondary particles created in the reaction of particles from cosmic radiation with the atmosphere, such as protons, electrons, positrons and/or neutrons.

For determining the influence of soft errors on the operation of an integrated circuit, measurements of a soft error rate (SER) at which soft errors occur may be performed.

One method of measuring a soft error rate occurring in the operation of an integrated circuit of a particular design is to test a large number of actual integrated circuits under typical use conditions for a relatively long period of time until enough soft errors have been accumulated to give a reasonably confident estimate of the soft error rate. This is denoted as "unaccelerated soft error rate testing."

Unaccelerated soft error rate testing may have the advantage of being a direct measurement of the soft error rate occurring under typical use conditions. However, unaccelerated soft error rate testing can require the monitoring of a relatively large number of integrated circuits (hundreds or thousands) in parallel for relatively long periods of time (weeks or months). Therefore, unaccelerated soft error rate testing can be expensive and time consuming.

An alternative method for measuring a soft error rate is accelerated soft error rate testing. In accelerated soft error rate testing, integrated circuits are exposed to a specific radiation source whose intensity is much higher than the ambient levels of radiation the device would normally encounter. Accelerated soft error rate testing may allow obtaining useful data in a shorter amount of time than unaccelerated soft error rate testing, and a smaller number of integrated circuits may be required. Accelerated soft error rate testing has been employed, in particular, for measuring soft errors caused by alpha particle radiation.

Alpha particles are strongly ionizing. Therefore, alpha particles impinging on a semiconductor material in an integrated circuit, such as silicon, may create bursts of free electron-hole pairs, which may produce a current spike in the integrated circuit. These current spikes may be large enough to alter the data state on some circuits.

Since alpha particles typically have a relatively small penetration depth in matter, in accelerated testing of an alpha particle induced soft error rate, a surface of a device under test, such as an integrated circuit, is typically directly exposed to alpha radiation created by an alpha particle source without any intervening solid material and with a relatively small air gap. The device under test may be provided in a special package for alpha particle testing, wherein it is fixed and wire bonded within a well or cavity of the package.

An alpha particle source, for example, a radioactive source including a radioactive isotope that emits alpha particles, is provided adjacent the device under test. The device under test is operated, and errors occurring in the operation of the device are counted. For example, in the testing of an integrated circuit including a memory array, a known data pattern may be stored in the memory array, while the integrated circuit is exposed to the alpha particle source, and the stored pattern that is present in the memory array after the exposure to alpha particles may be compared with the known data pattern, wherein changes in the pattern are identified as errors.

Methods for accelerated testing for soft errors induced by alpha particles are described in JEDEC Standard JESD89A, "Measurement and Reporting of Alpha Particle and Terrestrial Cosmic Ray-Induced Soft Errors in Semiconductor Devices," published by JEDEC Solid State Technology Association 2001, 2500 Wilson Boulevard, Arlington, Va. 22201-3834.

Testing a sample of an integrated circuit, such as a static random access memory device (SRAM), may require scheduling a sample for a special backend processing that is performed for preparing the samples for wire bonding. This may require the use of a special mask that is employed for photolithography processes that are performed in the special backend processing. Typically, lots with a good yield are identified and treated as process of record (POR) lots.

The process of record lots are measured "inline" at wafer level for performing a functional testing. Good devices under test (DUTs) are selected, special wire bonding packages are designed, and finally the samples are built up as wire bonded samples. For the selected wire bonding package, sockets are ordered, and sample boards for testing by means of an automatic test equipment (ATE) are designed, ordered and checked. This may require relatively high resources of time, manpower and costs for development and delivery. Typically, a time delay between a first silicon test of a particular device and a final soft error rate test may be in a range from about 2 months to about 6 months, depending on whether automatic test equipment boards are reused or used for the first time. Additionally, the time delay may depend on the level of technology and the complexity of the qualified memories.

With respect to this relatively high effort, in many cases, the number of soft error rate samples employed for soft error rate testing is typically reduced to the minimal possible value, for example to 15 samples from three different lots. However, this may reduce the possibilities of performing a real soft error rate oriented design development. If the qualification of a particular integrated circuit for soft error rate fails, there may be a relatively high loss of time.

In view of the situation described above, the present disclosure provides apparatuses and methods wherein some or all of the above-mentioned issues may be overcome or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative apparatus disclosed herein includes a probe card, an alpha particle source and a shutter. The probe card includes a plurality of contact elements that define a measuring position. The shutter is arranged between the alpha particle source and the measuring position. The shutter is moveable between a closed position and an open position. Alpha particles from the alpha particle source reach the measuring position when the shutter is in the open position and the alpha particles are blocked from reaching the measuring position when the shutter is in the closed position.

An illustrative method disclosed herein includes providing an apparatus. The apparatus includes an alpha particle source and a shutter arranged between the alpha particle source and an irradiation area. A wafer including a first semiconductor device is provided. The wafer is positioned so that at least a part of the first semiconductor device is located in the irradiation area. A first test of the first semiconductor device is performed. The shutter is maintained in a closed position during the first test. A second test of the semiconductor device is performed. The shutter is maintained in an open position during at least a part of the second test. The shutter allows alpha particles to reach the first semiconductor device when the shutter is in the open position, and it blocks alpha particles from reaching the first semiconductor device when the shutter is in the closed position.

BRIEF DESCRIPTION OF THE DRAWINGS

The disclosure may be understood by reference to the following description taken in conjunction with the accompanying drawings, in which like reference numerals identify like elements, and in which:

FIGS. 3a and 3b show a schematic top view of components of the apparatus of FIG. 1, wherein FIG. 3a shows a shutter of the apparatus in an open position and FIG. 3b shows the shutter in a closed position;

Figure 1:
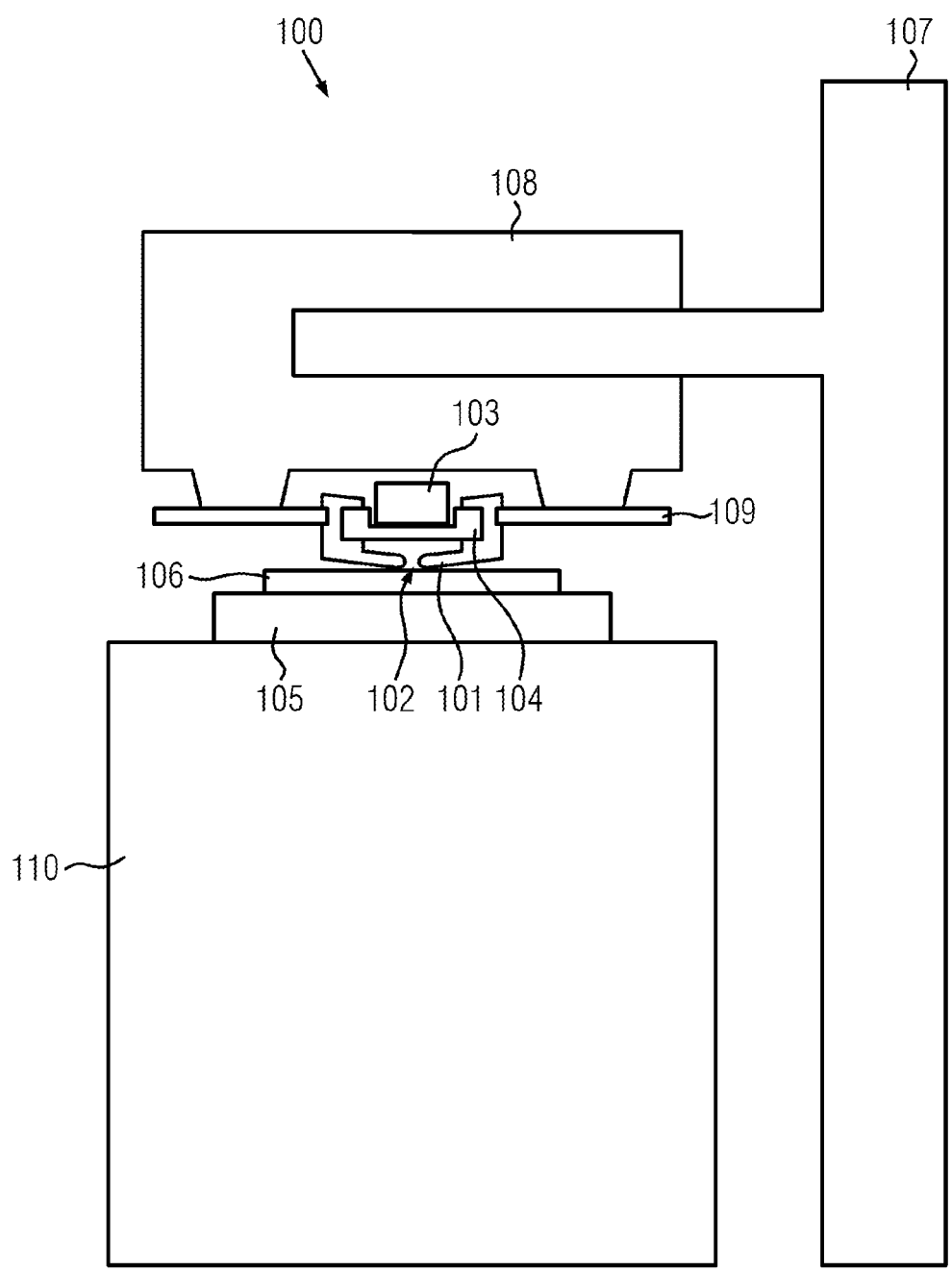
FIG. 1 schematically illustrates an apparatus according to an embodiment of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

The present disclosure provides apparatuses and methods that may allow performing accelerated alpha particle soft error rate measurements on a wafer level, without using specially boxed samples, such as samples provided in special packages and connected thereto by means of wire bonding. A probe card including a relatively wide opening and carrying a container for a radioactive source, as well as a shutter which switches the radioactive source on and off for wafer irradiation and probe card alignment and handling, may be used.

To develop new technologies, circuits are typically tested on a wafer level. For example, memory devices may be tested early in the manufacturing process after the formation of the lowest backend layer, when the memory circuit is functional. The tests may be performed before the completion of the formation of all of the backend layers, for example, after the formation of about half of the backend layers. The tests may include a wafer level memory test. These tests may be independent of soft error rate tests, and may be performed for technology development as well as for monitoring the yield of the manufacturing process.

Embodiments of the present disclosure allow additionally performing soft error rate measurements on a wafer when memory tests for yield monitoring as described above are performed, without preparing samples including higher backend layers that include a wire bond mask.

Embodiments of the present disclosure provide a process and an irradiation environment that allow irradiation of memory circuits directly on the wafer. Hence, manufacturing the full backend, and providing a special wire bonding mask for special photolithography processes that are performed for preparing samples for wire bonding, as well as special packages, board and sockets for soft error rate measurements, may be omitted.

Hence, processing steps, such as a formation of a wire bonding backend, and a design of a wire bonding mask, may be omitted. Moreover, additional sample test preparations, such as a packaging of samples and a development of special circuit boards, as well as an additional lot scheduling for soft error rate qualification, may be omitted. Instead, non-destructive tests may be performed on the fly at standard and development lots for any wafer identified as good, while requiring only a small amount of additional effort or substantially no additional effort.

A testing of complete wafers is possible, which may allow investigating special wafer pattern dependencies of a soft error rate, for example different soft error rates occurring at the edge of a wafer, at the center of the wafer and in a ring-shaped area between the edge and the center, denoted as "donut." Moreover, engineering request form (ERF, being a formular process to handle requests to change anything against the default manufacturing process, i.e., experiments) dependencies may be investigated for finding the root cause of unknown soft error rate dependencies.

Methods and apparatuses according to embodiments of the present disclosure may provide a relatively high throughput of tested devices, which may allow the testing of experimental memory devices, for example devices with a different cell design, allowing an investigation of reasons for a lower likelihood of soft errors occurring in some designs as compared to other designs.

An influence of higher backend layers on the measured soft error rates may be excluded by performing measurements before completion of the backend, or the influence of the higher backend layers on the measured soft error rates may be investigated in detail by adding higher backend layers to the wafer before performing the wafer level soft error rate measurements.

Hence, in embodiments, an effort of soft error rate measurements and costs associated with soft error rate measurements may be reduced, which may allow a higher throughput.

In apparatuses according to embodiments of the present disclosure, a shutter may be provided for allowing a passage of alpha particles to an integrated circuit under test and for blocking the alpha particles, if necessary. Thus, removing the alpha particle source is not necessary for performing measurements or parts of measurements in the absence of alpha particle irradiation. Therefore, an alpha particle source may be maintained at a substantially fixed position relative to a measuring position at which a semiconductor device on the wafer is provided during a number of measurements. This may help to increase the accuracy of the soft error rate measurements, and may reduce error variance.

Due to reduced costs of the method for performing soft error rate tests, a monitoring of failure in time (FIT) rates related to soft errors may be performed. Moreover, standard monitoring test programs for memories may be reused and adapted for performing soft error rate measurements, which may allow a reduction of test development time and costs, and may allow a comparison of results of soft error rate measurements with results of standard monitoring tests.

In the following, further embodiments of the present disclosure will be described with reference to the figures.

FIG. 1 shows a schematic view of an apparatus 100 according to an embodiment. For simplicity, in FIG. 1, some components of the apparatus 100 have been omitted. FIGS. 2, 3a, 3b and 4, which illustrate parts of the apparatus 100 in more detail, show components of the apparatus 100 that have been omitted in FIG. 1.

The apparatus 100 includes a probe card 109. The probe card 109 includes a plurality of contact elements 101 that define a measuring position 102. The apparatus 100 further includes an alpha particle source 103 and a shutter 104. The shutter 104 is arranged between the alpha particle source 103 and the measuring position 102. As will be explained in more detail below, the shutter 104 is movable between a closed position and an open position. When the shutter 104 is in the open position, alpha particles from the alpha particle source 103 may reach the measuring position 102. When the shutter 104 is in the closed position, the alpha particles from the alpha particle source 103 are blocked from reaching the measuring position 102.

The apparatus 100 further includes a wafer holder 105. The wafer holder 105 may receive a semiconductor wafer 106. As will be explained in more detail below, the wafer 106 may include one or more semiconductor devices, for example, memory circuits, logic circuits, field programmable gate arrays and/or microprocessors. The wafer holder 105 may hold the wafer 106 such that one of the semiconductor devices is at the measuring position 102. The contact elements 101 are adapted to provide an electrical connection to the one of the semiconductor devices provided at the measuring position 102.

The apparatus 100 further includes an automatic test equipment 107 and a test head 108. The probe card 109 may be attached to the test head 108. The test head 108 may be movable in a vertical direction that is substantially perpendicular to a surface of the wafer 106 provided on the wafer holder 105 (vertical in the plane of drawing of FIG. 1), wherein the contact between the contact elements 101 and the one of the semiconductor devices on the wafer 106 may be provided by lowering the probe card 109 towards the wafer 106.

The wafer holder 105 may be provided in and/or at a prober 110. The prober 110 may be adapted to move the wafer holder 105 in horizontal directions that are parallel to the surface of the wafer 106 provided on the wafer holder 105 (horizontal in the plane of drawing of FIG. 1 and perpendicular to the plane of drawing of FIG. 1) for positioning the wafer 106 relative to the probe card 109.

In other embodiments, the test head 108 and the probe card 109 attached thereto may be maintained at a fixed location, and the prober 110 may be adapted to move the wafer holder 105 in the vertical direction, in addition to being adapted to move the wafer holder 105 in the horizontal directions.

Figure 2:
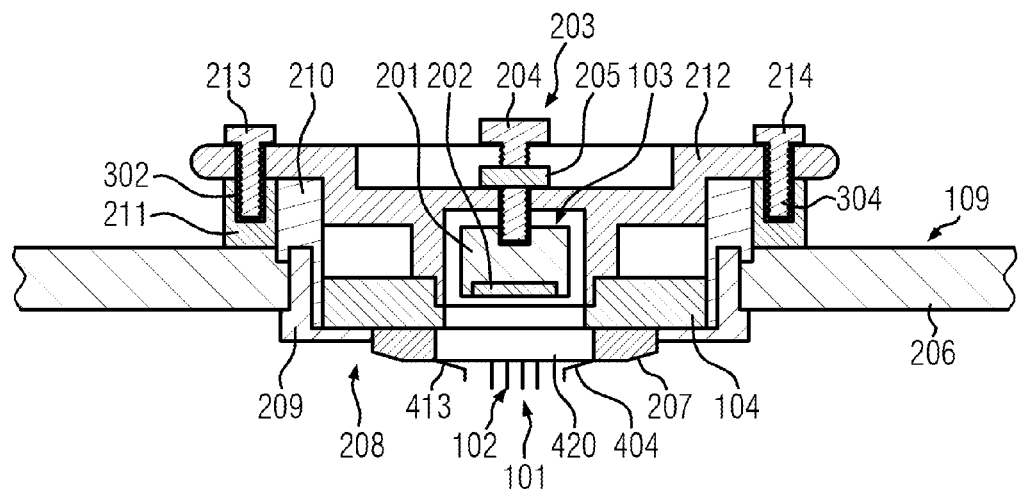
FIG. 2 shows a schematic cross-sectional view of components of the apparatus of FIG. 1.

FIG. 2 shows a schematic cross-sectional view of the probe card 109. The probe card 109 includes a circuit board 206. The circuit board 206 may be a printed circuit board, and may include electrically conductive lines providing an electrical connection between the contact elements 101 and the automatic test equipment 107. In embodiments, the circuit board 206 may include contact pins which are electrically connected to cables extending through the probe head 108 and electrically connecting the circuit board 206 to the automatic test equipment 107.

In addition to electrically conductive lines, the circuit board 206 may include electrical circuits including circuit elements, such as capacitors, resistors, relays and/or transistors. Such circuit elements may be used for manipulating and controlling signals that are passed between the automatic test equipment 107 and one of the semiconductor devices on the wafer 106 to which contact is provided by the contact elements 101.

Further features of the circuit board 206 may correspond to features of circuit boards employed for probe cards that are used for functional tests of semiconductor devices during and/or after the manufacturing process.

The probe card 109 further includes a contact element holder 207 to which the contact elements 101 are attached. A schematic top view of the contact element holder 207 showing details of the contact element holder 207 and the contact elements 101 is shown in FIG. 4.

The contact element holder 207 may be a ring-shaped component including an electrically insulating material, for example, a ceramic material. The contact elements 101 may be provided at a bottom side of the contact element holder 207 facing the wafer 106 provided on the wafer holder 105.

Figure 4:
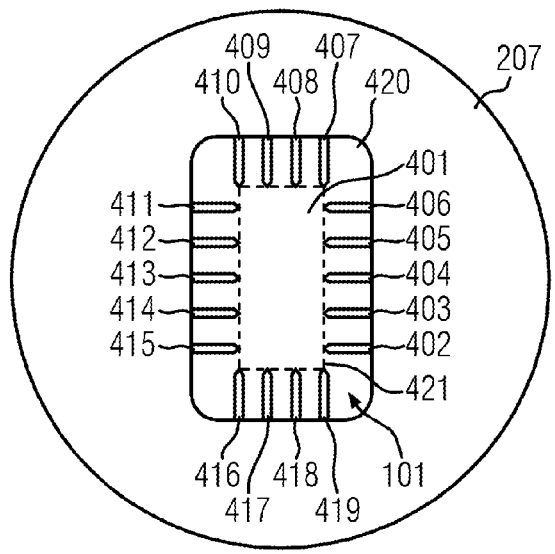
FIG. 4 shows a schematic top view of components of the apparatus of FIG. 1.

The contact elements 101 may be provided in the form of a plurality of needles 402 to 419 (see FIG. 4). The needles may be attached to the bottom side of the contact element holder 207, for example by means of glue. In embodiments, the glue may include an epoxy. Each of the needles 402 to 419 has a tip arranged at a perimeter of an irradiation area 421 that is located at the measuring position 102.

The irradiation area 421 may have a rectangular shape, as shown in FIG. 4, which may correspond to the shape of a semiconductor device formed on the wafer 106 or a shape of portions of the semiconductor device. The positions of the tips of the needles 402 to 419 may correspond to the arrangement of contact pads of the semiconductor devices provided on the wafer 106, so that each of the needles 402 to 419 may provide an electrical connection to one of the contact pads when the semiconductor device is positioned at the measuring position 102 and is contacted by means of the probe card 109.

The contact element holder 207 may include an opening 420 that is provided above the irradiation area 421. The needles 402 to 419 may extend away from the irradiation area 421 toward an edge of the opening 420. Thus, alpha particles from the alpha particle source 103 moving along the vertical direction (vertical in the views of FIGS. 1 and 2 and perpendicular to the plane of drawing of FIGS. 3a, 3b and 4) may reach the irradiation area 421, and only a small amount of alpha particles moving along the vertical direction is absorbed by the needles 402 to 419.

As will be explained in more detail below, some alpha particles from the alpha particle source 103 moving in directions that are inclined relative to the vertical direction may be absorbed by the needles 402 to 419. Therefore, portions of semiconductor devices arranged at the center of the irradiation area 421 may be irradiated with a slightly greater intensity of alpha radiation than portions of the semiconductor devices in the vicinity of the perimeter of the irradiation area 421.

In embodiments, the tips of the needles 402 to 419 may be bent downward, as schematically shown in FIG. 2. The needles 402 to 419 may be electrically connected to electrically conductive lines on the circuit board 206 by means of wires, each wire being connected between one of the needles 402 to 409 and one of a plurality of electrically conductive lines on the circuit board 206.

As shown in the cross-sectional view of FIG. 2, the probe card 109 may further include a ring-shaped structure 208 including portions 209, 210, 211. The portion 209 may be connected between the contact element holder 207 and the circuit board 206. An inner edge of the circuit board 206 may be provided between the portion 209 and the portion 210 of the ring-shaped structure 208, so that the circuit board 206 is fixed to the ring-shaped structure 208. The portion 211 may annularly enclose the portion 210, and may include screw holes 302, 303, 304, 305 (see FIGS. 3a and 3b wherein the portions 210, 211 of the ring-shaped structure 208 are shown in top view) that may receive screws, two of which are denoted by reference numerals 213, 214 in FIG. 2. The screws 213, 214 may provide a connection between the portion 211 of the ring-shaped structure 208 and an alpha particle source holder 212 to which the alpha particle source 103 is connected, as will be detailed below.

The portions 209, 210, 211 of the ring-shaped structure 208 may be connected to each other and to the circuit board 206 by gluing, or may be mechanically fixed by screws or pressed into fixed form handles.

The alpha particle source 103 may include a radioactive material 202 emitting alpha particles. In embodiments, the radioactive material 202 may include americium 241 ($^{241}$Am), and may have an activity of about 10 kBq or more, in particular an activity in a range from about 10 kBq to about 100 MBq, for example an activity of about 3.7 MBq. In other embodiments, other radioactive materials emitting alpha particle radiation may be used, for example, thorium 232 ($^{232}$Th).

The alpha particle source 202 may further include a container 201. In embodiments, the radioactive material 202 may be provided in a recess at a side of the container 201 that faces the wafer 106 provided in the wafer holder 105 (at the bottom of the container 201 in the view of FIG. 2).

The alpha particle source 103 may be attached to the alpha particle source holder 212. The probe card 109 may include an adjuster 203 which can, for example, be provided in the form of a screw 204 and a nut 205 for adjusting the position of the alpha particle source 103. The adjuster 203 may be employed for modifying a distance between the alpha particle source 103 and the measuring position 102 where a semiconductor device on the wafer 106 is provided when a measurement of a soft error rate of the semiconductor device is performed.

The distance between the radioactive material 202 in the alpha particle source 103 that emits alpha particles and the semiconductor device may have an influence on the intensity of alpha radiation received by the semiconductor device, and on the angular distribution of alpha particles received by the semiconductor device. In embodiments, the distance between the radioactive material 202 and the measuring position 102 may be in a range from about 5 mm to about 14 mm, for example, about 7.4 mm.

The radioactive material 202, or at least a portion thereof exposed at the bottom side of the alpha particle source 103 facing the measuring position 102, provides an emitting area of the alpha particle source 103. A diameter of the emitting area of the alpha particle source 103 may be provided by a minimum extension of the emitting area along any direction lying in a plane parallel to the surface of the wafer 106 that is provided in the wafer holder 105 (perpendicular to the plane of drawing of FIG. 2 and parallel to the plane of drawing of FIGS. 3a and 3b). In some embodiments, the emitting area of the alpha particle source 103 may be approximately circular. In such embodiments, the diameter of the emitting area of the alpha particle source 103 corresponds to the diameter of the circular emitting area.

The diameter of the emitting area of the alpha particle source 103 may be greater than a maximum extension of the irradiation area 421 along any direction lying in the plane parallel to the surface of the wafer 106 provided in the wafer holder 105. This may help to obtain an irradiation of the semiconductor device located at the measuring position 102 from a plurality of angles by alpha particles. In embodiments wherein the irradiation area 421 has an approximately rectangular shape, as shown in FIG. 4, the maximum extension of the irradiation area 421 along any direction lying in the plane parallel to the surface of the wafer 106 provided in the wafer holder 105 corresponds to a length of a diagonal of the irradiation area. In embodiments, the emitting area of the alpha particle source 103 may have a substantially circular shape with a diameter in a range from about 0.5 cm to about 2 cm, for example, a diameter of about 1.10 cm. The maximum extension of the irradiation area 421 along any direction lying in a plane parallel to the surface of the wafer 106 provided in the wafer holder 105 (the length of the diagonals of the rectangle in the case of a rectangular irradiation area 421 as shown in FIG. 4) may be in a range from about 0.4 cm to about 1.5 cm, for example, about 0.95 cm.

Figure 3A:
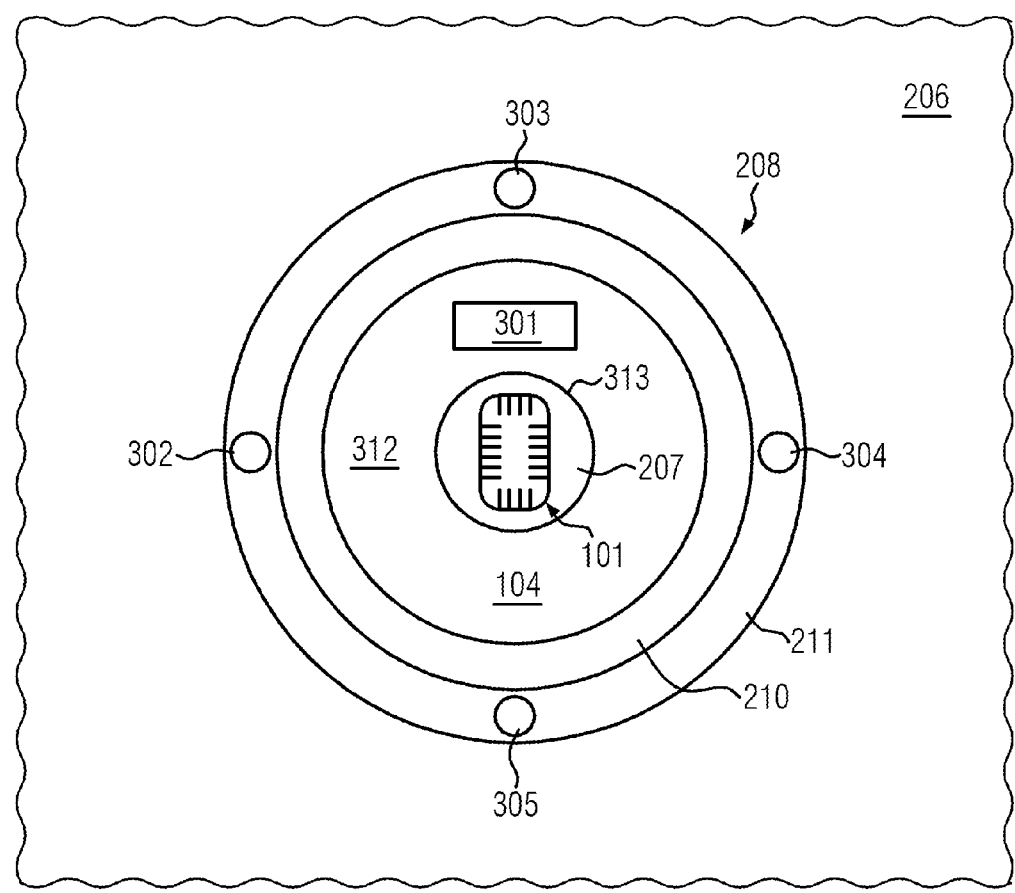
Figure 3B:
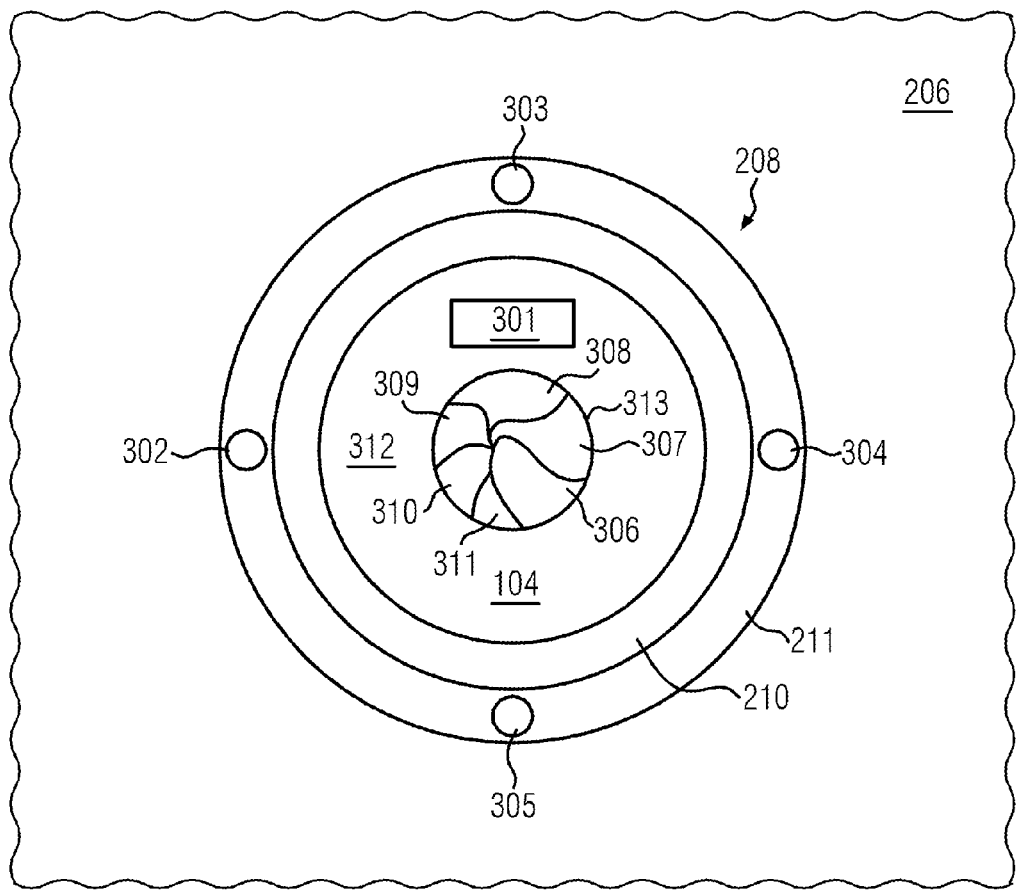

As already mentioned above, the shutter 104 provided between the alpha particle source 103 and the measuring position 102 is movable between a closed position and an open position. FIGS. 3a and 3b show schematic top views of the probe card 109 with the alpha particle source holder 212 and the alpha particle source 103 removed. FIG. 3a shows a top view of the probe card 109 with the shutter 104 in the open position, and FIG. 3b shows a schematic top view of the probe card 109 with the shutter 104 in the closed position.

The shutter 104 may include a ring-shaped structure 312 with a central opening 313. Additionally, the shutter 104 may include a plurality of shutter leaves 306 to 311. The shape of the shutter leaves 306 to 311 may be substantially identical. In FIG. 3b, portions of shutter leaves 307 to 311 are covered by adjacent shutter leaves. Shutter leaf 306, being closest to the viewer in the perspective of FIG. 3b, shows the shape of the portions of the shutter leaves 306 to 311 that close the central opening 313 of the shutter 104 when the shutter 104 is in the closed position.

When the shutter 104 is in the open position, as shown in FIG. 3a, the shutter leaves 306 to 311 are inside the ring-shaped structure 312 of the shutter 104, for example, in a space between a top plate and a bottom plate of the ring-shaped structure 312.

Additionally, the shutter 104 may include mechanical components (not shown) for moving the shutter leaves 306 to 311 between the position inside the ring-shaped structure 312 and a position wherein at least a portion of each of the shutter leaves 306 to 311 is provided in and/or in front of the central opening 313 of the shutter 104, so that the central opening 313 of the shutter 104 is closed by the plurality of shutter leaves 306 to 311.

The mechanical components employed for moving the shutter leaves 306 to 311 may correspond to mechanical components employed in leaf shutters used in photographic cameras. The shutter leaves 306 to 311 may have a relatively small thickness, the thickness being an extension of the shutter leaves 306 to 311 in a vertical direction perpendicular to the surface of the wafer 106 provided in the wafer holder 105. Thus, a relatively small mass of the shutter leaves 306 to 311 may be provided, which may allow a relatively fast movement of the shutter leaves 306 to 311. Since alpha particles emitted by the alpha particle source 103 may have a relatively small penetration depth in materials such as, for example, metals from which the shutter leaves 306 to 311 may be formed, a relatively small thickness of the shutter leaves 306 to 311 may be sufficient for blocking alpha particles from the alpha particle source 103 from reaching the measuring position 102 when the shutter 104 is in the closed position.

The shutter 104 may further include an actuator 301 for moving the shutter leaves 306 to 311 when the shutter 104 is moved between the closed position and the open position. The actuator 301 may include an electromagnet and a permanent magnet. A mechanical force between the electromagnet and the permanent magnet may be created by applying an electric current to the electromagnet. In other embodiments, the actuator may include a pair of electromagnets. In such embodiments, a mechanical force may be provided by applying an electric current to both electromagnets. In embodiments, the actuator 301 may include a voice coil actuator.

The actuator 301 may be connected to the mechanics for moving the shutter leaves 306 to 311. Thus, the shutter 104 may be moved between the closed position and the open position by controlling an electric current applied to the actuator 301, in particular by switching the current applied to the actuator 301 on and off.

The present disclosure is not limited to embodiments wherein the actuator 301 may be operated by applying a current to the actuator 301. In other embodiments, the actuator 301 may include a pneumatically operated actuator, so that the shutter 104 may be moved between the open position and the closed position by supplying a fluid, for example, a gas such as air, to the pneumatic actuator. In further embodiments, the actuator 301 may be omitted and the shutter 104 may be operated manually by an operator.

Moreover, the present disclosure is not limited to embodiments wherein the shutter 104 includes a plurality of shutter leaves 306 to 311. In other embodiments, a single shutter leaf can be employed. Moreover, in embodiments wherein a plurality of shutter leaves is used, the number of shutter leaves may be different from 6, as shown in FIG. 3b. Generally, the number of shutter leaves may be one or more.

Figure 5:
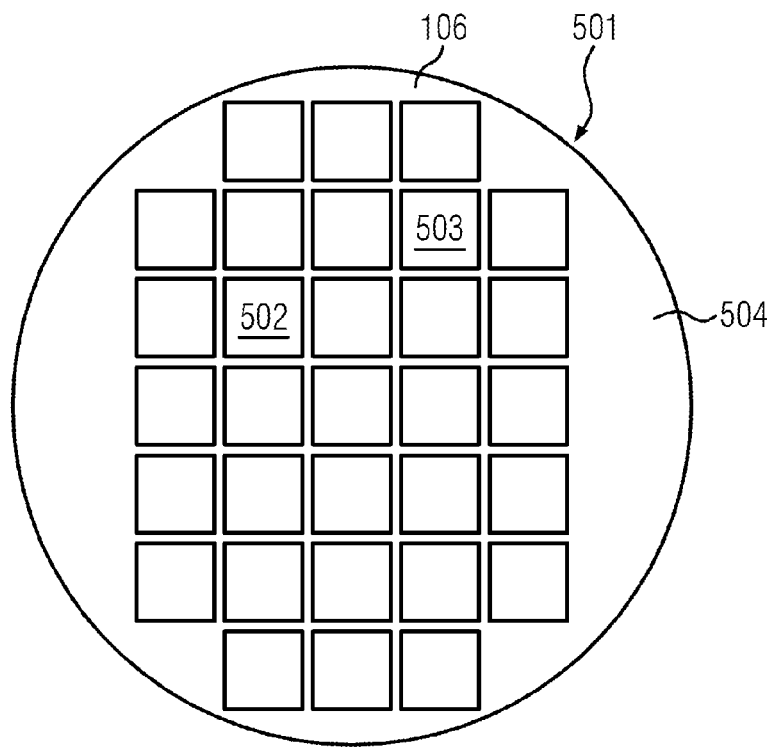
FIG. 5 schematically illustrates a wafer that may be tested for soft errors in embodiments of the present disclosure.

FIG. 5 shows a schematic top view of the wafer 106 that may be provided in the wafer holder 105 of the apparatus 100 for performing soft error rate tests and, optionally, further tests by means of the apparatus 100. The wafer 106 includes a disc-shaped substrate 504. The substrate 504 may be a bulk semiconductor substrate formed of a semiconductor material such as, for example, silicon. In other embodiments, the substrate 504 may be a semiconductor-on-insulator substrate including a layer of a semiconductor material, for example silicon, that is provided above a support substrate, which may also include a semiconductor material, such as silicon, and is separated therefrom by a layer of an electrically insulating material, for example silicon dioxide.

On the substrate 504, a plurality of semiconductor devices 501 may be formed. In FIG. 5, reference numerals 502, 503 denote an exemplary first semiconductor device 502 and an exemplary second semiconductor device 503 from the plurality of semiconductor devices 501.

Each of the plurality of semiconductor devices 501 may include an integrated circuit, wherein the configuration of each of the plurality of semiconductor devices 501 may be substantially identical. In embodiments, each of the plurality of semiconductor devices 501 may include a memory circuit, for example, a static random access memory (SRAM) circuit or a dynamic random access memory (DRAM) circuit. In embodiments, each of the plurality of semiconductor devices 501 may include an integrated circuit designed with a ring-shaped pad layout outside of or around the circuit. In embodiments, each of the plurality of semiconductor devices 501 may include a semiconductor device other than a memory circuit, for example a logic circuit, a field programmable gated array or a microprocessor.

Figure 6:
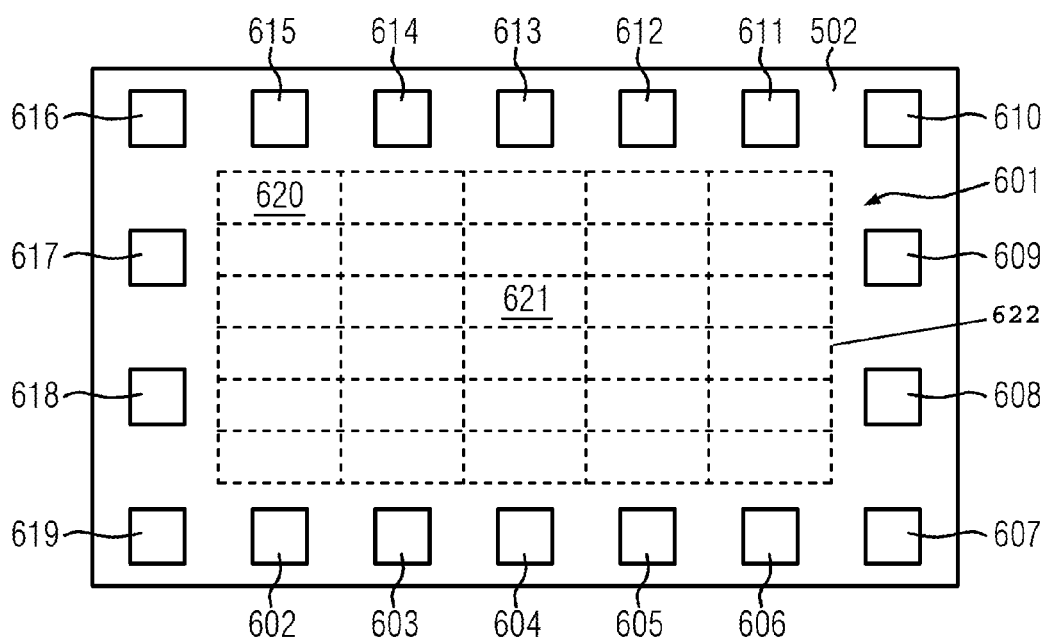
FIG. 6 schematically illustrates a semiconductor device in the wafer shown in FIG. 5.

FIG. 6 shows a schematic enlarged view of the first semiconductor device 502 formed on the wafer 106 in an embodiment wherein the semiconductor device 502 includes a memory device 601. The memory device 601 may include a plurality of memory banks 622, wherein reference numerals 620, 621 denote an illustrative first memory bank and an illustrative second memory bank, respectively, from the plurality of memory banks 622. The first memory bank 620 is arranged relatively close to the perimeter of the semiconductor device 502, whereas the memory bank 621 is arranged relatively close to the center of the semiconductor device 502.

In embodiments, the plurality of memory banks 622 may include 96 memory banks, each having a storage capacity of 256 kBit. Each memory bank of the plurality of memory banks 622 may include a plurality of memory cells. In embodiments, each of the memory cells may be an SRAM memory cell, wherein one bit of information is stored per memory cell. The memory cells of each memory bank of the plurality of memory banks 622 may be arranged in a plurality of rows and columns, wherein the memory cells in each row are connected to a common wordline associated with the respective row, and the memory cells in each column are connected to a common pair of bitlines associated with the respective column.

The semiconductor device 502 further includes a plurality of contact pads 602 to 619 arranged at the perimeter of the semiconductor device 502. The arrangement of the contact pads 602 to 619 and the arrangement of the tips of the needles 402 to 419 of the probe card 109 substantially correspond to each other. Thus, when the semiconductor device 502 is provided at the measuring position 102 of the apparatus 100, each of the contact pads 602 to 619 may be contacted with the tip of a respective one of the plurality of needles 402 to 419 of the probe card 109.

Additionally, the semiconductor device 502 may include control circuitry (not shown) electrically connected to the contact pads 602 to 619 and the plurality of memory banks 622 for writing data to the memory cells in the plurality of memory banks 622, and for reading data from the plurality of memory banks 622.

The other semiconductor devices of the plurality of semiconductor devices 501 on the wafer 106, for example the semiconductor device 503, may have a configuration corresponding to that of the semiconductor device 502.

The plurality of semiconductor devices 501 formed on the wafer 106 need not be substantially complete semiconductor devices including each of the features that are provided in a semiconductor device when the wafer 106 is cut into dies and the dies are packaged. In embodiments, each of the plurality of semiconductor devices 501 may include memory cells, control circuits for writing data to the memory cells and for reading data from the memory cells, and only a part of the backend layers that are provided in the complete semiconductor device, in particular, a backend layer including bitlines and wordlines. The backend layer including the bitlines and wordlines may be the lowest backend layer.

After testing the wafer 106 by means of the apparatus 100, additional backend layers may be formed over the wafer 106. Thereafter, the wafer 106 may be cut into dies, and the semiconductor devices may be packaged.

In other embodiments, the plurality of semiconductor devices 501 may include all the backend layers that are provided in the complete semiconductor devices when the wafer 106 is tested by means of the apparatus 100. In such embodiments, the wafer 106 may be cut into dies after testing the wafer 106 by means of the apparatus 100.

In the following, a method for testing one or more semiconductor devices formed on a wafer, for example for testing the first semiconductor device 502 and the second semiconductor device 503 formed on the wafer 106 and, optionally further semiconductor devices of the plurality of semiconductor devices 501 on the wafer 106, will be described.

The shutter 104 may be moved into the closed position so that the shutter 104 blocks alpha particles from the alpha particle source 103. The wafer 106 may be provided on the wafer holder 105. Thereafter, the prober 110 and/or the test head 108 may be operated for positioning the wafer holder 105 and the wafer 106 provided thereon such that one of the semiconductor devices formed on the wafer 106, for example the semiconductor device 502, is located at the measuring position 102. When the semiconductor device 502 is at the measuring position 102, an electrical contact between the contact elements 101 and the semiconductor device 502 may be established by providing a contact between the tips of the needles 402 to 419 and the contact pads 602 to 619 of the semiconductor device.

Thereafter, a first test of the semiconductor device 502 may be performed. For this purpose, the automatic test equipment 107 may apply electric signals to the contact pads 602 to 619 of the semiconductor device 502 by applying electric signals to the needles 402 to 419 through the circuit board 206. Additionally, the automatic test equipment 107 may receive signals from the semiconductor device 502 through the needles 402 to 419 and the circuit board 206. During the first test, the shutter 104 may be maintained in the closed position. Thus, the semiconductor device 502 is substantially not irradiated by alpha particles from the alpha particle source 103 during the first test.

The first test may be a test of the semiconductor device 502 for functional defects. The first test may have features corresponding to conventional tests of semiconductor devices for functional defects which are performed during the manufacturing process or, alternatively, after the completion of the manufacturing process of the semiconductor devices on the wafer 106 before the wafer 106 is cut into dies.

In particular, in embodiments wherein the semiconductor device 502 includes a memory device 601 as described above with reference to FIG. 6, data may be written to the memory device 601, and the data may be read from the memory device 601. Then, the data read from the memory device 601 may be compared to the data written to the memory device 601, for determining if data are correctly stored in the memory device.

After the first test, if it has been determined in the first test that the memory device 601 is functioning correctly and correctly stores data written to the memory device 601, a second test may be performed. For performing the second test, the automatic test equipment 107 may apply electric signals to the contact pads 602 to 619 of the semiconductor device 502 by applying electric signals to the needles 402 to 419 through the circuit board 206.

The second test may include a measurement of soft errors in the semiconductor device 502 which are caused by an irradiation of the semiconductor device 502 by alpha particles. The test for soft errors caused by irradiation with alpha particles may be an accelerated test, wherein the shutter 104 of the apparatus 100 is maintained in an open position during at least a part of the test. Thus, alpha particles from the alpha particle source 103 can reach the semiconductor device 502 provided at the measuring position 102 of the apparatus 100.

The test of the semiconductor device 502 for soft errors caused by irradiation with alpha particles from the alpha particle source 103 may 6 include one or more measurement runs.

The memory device 601 may be exposed to alpha particles from the alpha particle source 103 during the one or more measurement runs. This may be done by moving the shutter 104 into the open position before the one or more measurement runs, for example by controlling a current supplied to the actuator 301, and maintaining the shutter 104 in the open position as long as the one or more measurement runs are performed.

In each of the measurement runs, a predetermined data pattern may be stored in the memory device 601. In some embodiments, the data pattern may be a logical checkerboard pattern, wherein logical zeroes and logical ones are stored in the memory cells of the memory device 601, alternating by address and bit. Alternatively, a physical checkerboard pattern may be used, wherein logical zeroes and logical ones are stored in the memory cells of the memory device 601 in such a manner a logical one is stored in each of the nearest neighbor memory cells of a memory cell wherein a logical zero is stored, and a logical zero is stored in each of the nearest neighbor memory cells of a memory cell wherein a logical one is stored.

After exposing the memory device 601 with the predetermined data pattern stored therein to alpha particles from the alpha particle source 103, the data stored in the memory device 601 may be read, and the read data may be compared with the predetermined data pattern. Differences between the predetermined data pattern and the data read from the memory device 601 may be determined by comparing the data read from the memory device 601 with the predetermined data pattern, and the differences may be recorded as detected soft errors.

The determination of soft errors may include an identification of different types of soft errors. Soft errors identified from the comparison between the predetermined data pattern and the data read from the memory device 601 may include single bit events, wherein a data bit read from the memory device 601 differs from the data bit stored therein, but data bits stored in memory cells adjacent the memory cell are identical to the data bits of the predetermined data pattern stored therein. Additionally, soft errors may include multi bit events, wherein a number of adjacent memory cells include data bits which differ from the data bits of the predetermined data pattern stored therein.

After performing a plurality of test runs as described above, statistical data from the test runs, such as the frequency of errors of a particular type occurring, may be calculated and reported. Additionally, rates of soft errors determined in the test runs may be extrapolated to actual use conditions.

After performing the first test and the second test of the semiconductor device 502 as described above, the shutter 104 may be moved into the closed position, and the prober 110 and/or the test head 108 may be operated for positioning the wafer holder 105 and the wafer 106 provided thereon such that another one of the plurality of semiconductor devices 501 on the wafer 106, for example the semiconductor device 503, is located at the measuring position 102.

Then, tests of the semiconductor device 503, wherein the automatic test equipment 107 applies electric signals to the contact pads of the semiconductor device 503 by applying electric signals to the needles 402 to 419 through the circuit board 206 and receives signals from the semiconductor device 503 through the needles 402 to 419 and the circuit board 206, may be performed.

The tests of the semiconductor device 503 may include a first test wherein the shutter 104 of the apparatus 100 is maintained in the closed position. Features of the first test of the semiconductor device 503 may correspond to features of the first test of the semiconductor device 502 described above. In particular, the first test of the semiconductor device 503 may include a test of the semiconductor device 503 for functional errors.

Thereafter, a second test of the semiconductor device 503 may be performed. During at least a part of the second test of the semiconductor device 503, the shutter 104 may be maintained in the open position, so that the semiconductor device 503 is exposed to alpha particle radiation from the alpha particle source 103 during at least a part of the second test. Features of the second test of the semiconductor device 503 may correspond to features of the second test of the semiconductor device 502 described above. In particular, the second test of the semiconductor device 503 may include a test of the semiconductor device 503 for soft errors.

In some embodiments, a first test and a second test as described above may be performed for each semiconductor device of the plurality of semiconductor devices 501 on the wafer 106. Alternatively, a first and a second test as described above may be performed for a part of the semiconductor devices 501 only.

In embodiments, the data relating to soft error rates occurring in the plurality of semiconductor devices 501 on the wafer 106 may be used for investigating a dependency of the rate of soft errors occurring in a semiconductor device on the position of the respective semiconductor device on the wafer 106. For example, the data concerning soft error rates may be analyzed for differences in the soft error rate between semiconductor devices located in an "edge" region of the wafer 106 close to the edge of the wafer 106, a "center" region of the wafer 106 located close to the center of the wafer 106, and a "donut" region between the edge region and the center region.

In embodiments, a calibration of the apparatus 100 may be performed. The calibration of the apparatus 100 may include a measurement of an activity of the alpha particle source 103. For this purpose, an intensity of gamma radiation emitted by the radioactive material 202 in the alpha particle source 103 may be measured, for example, by means of a gamma spectrometer. When a radioactive nucleus of the radioactive material 202 decays and emits alpha radiation, the daughter nucleus formed in the decay process may be in an excited state, and may later pass into the ground state. In doing so, the daughter nucleus may emit gamma radiation. Therefore, the intensity of gamma radiation emitted by the alpha particle source 103 may be representative of the activity of the alpha particle source 103. Different from alpha particle radiation, gamma radiation is absorbed to a lesser extent in the radioactive material 202 itself and/or in other components of the alpha particle source 103, such as the container 201, so that a relatively precise measurement of the activity of the alpha particle source 103 may be obtained by means of gamma spectroscopy.

For measuring the activity of the alpha particle source 103, the alpha particle source 103 may be removed from the apparatus 100 and brought into the vicinity of the gamma spectrometer. From the intensity of gamma radiation emitted by the alpha particle source 103, the activity of the alpha particle source 103 may be calculated.

The measured activity of the alpha particle source 103 may be related to the intensity of alpha radiation emitted into the full solid angle. A part of the alpha radiation emitted into the full solid angle may be received in the irradiation area 421 at the measuring position 102. The calculation of the intensity of the alpha particle radiation at the measuring position 102 may be performed using known methods. For example, the calculations may employ geometry factors, as described in the JEDEC Standard JESD89A cited above, the disclosure of which is incorporated herein by reference.

In some embodiments, the calibration of the apparatus 100 may further include a correction of inhomogeneities of the intensity of the alpha particle radiation obtained in the irradiation area 421 which may be caused by an absorption of alpha particles by the needles 402 to 419. In particular, the needles 402 to 419 may absorb alpha particles impinging on portions of the semiconductor device 502 which are relatively close to the perimeter of the irradiation area 421 from oblique angles.

The inventors have performed experiments wherein the number of soft errors obtained in a semiconductor device 502 including a plurality of memory banks 622 as described above with reference to FIG. 6 was measured. It was found that a significantly smaller amount of soft errors may be obtained in memory banks close to the perimeter of the irradiation area 421, such as, for example, memory bank 620, than in memory banks close to the center of the irradiation area, such as, for example, memory bank 621. The number of soft errors obtained in memory banks at the perimeter of the irradiation area 421 may be about 10 percent smaller than the average number of soft errors obtained in the plurality of memory banks 622, and the number of soft errors obtained in memory banks close to the center of the irradiation area 421 may be about 6 percent greater than the average number of soft errors.

In embodiments, the absorption of alpha particles by the needles 402 to 419 may be taken into account by dividing the number of soft errors obtained in each of the plurality of memory banks 622 by a calibration factor determined for the location of the respective memory bank. For determining the calibration factor, a ratio between a number of soft errors measured in a memory bank at a particular location of a memory device and an average number of soft errors obtained in the plurality of memory banks of the memory device may be determined. The ratio may be determined for a number of identical memory devices, and the calibration factor may be obtained by averaging the ratio over the number of identical memory devices. In other embodiments, the absorption of alpha particles by the needles 402 to 419 may be neglected, since, as described above, the inhomogeneity of the distribution of soft errors caused by the absorption of alpha particles by the needles 402 to 419 is relatively small.

Compared to methods for soft error rate testing wherein individual semiconductor devices are investigated, a method as described above wherein a wafer is investigated may allow a greater throughput. Thus, in the development process of a semiconductor device, for example a memory device, different designs of memory cells may be tested for soft error rates, and designs of memory cells wherein a likelihood of soft errors caused by alpha particle radiation is relatively low may be identified. This may allow a relatively quick optimization of designs of semiconductor devices for obtaining a relatively low likelihood of soft errors caused by alpha particle radiation.

Moreover, as described above, testing a semiconductor device for soft errors may be performed at the same time as a testing of semiconductor devices for functional errors. This may allow performing soft error rate tests of semiconductor devices in situ during a manufacturing process.

Moreover, due to the use of shutter 104 in the apparatus 100, the alpha particle source 103 need not be moved between tests wherein the semiconductor device under investigation is not exposed to alpha particle radiation and tests wherein the semiconductor device is exposed to alpha particle radiation. Hence, a number of different measurements may be performed, wherein the alpha particle source 103 is at exactly the same position, which may allow improving the accuracy of tests and a reduction of error variances.

In embodiments, a number of tests of the semiconductor wafer 106 as described above may be performed relatively early in a manufacturing process, for example after the formation of only a part of the backend of the semiconductor devices on the wafer 106, as soon as the plurality of semiconductor devices 501 on the wafer 106 is at least partially functional. After performing the tests as described above, the backends of the plurality of semiconductor devices 501 may be completed by means of known manufacturing processes, which include the deposition of one or more material layers on the wafer 106 and patterning processes such as photolithography, and the tests of the plurality of semiconductor devices 501 may be repeated. Thereafter, soft error rates of the plurality of semiconductor devices 501 obtained before the completion of the backend and soft error rates of the plurality of semiconductor devices 501 obtained after the completion of the backends may be compared. This may allow determining an influence of higher backend layers on the rates of soft errors caused by alpha particles.

The methods described above may be automatically performed by the automatic test equipment 107 of the apparatus 100. For this purpose, the automatic test equipment 107 may include components similar to those of conventional test equipment for semiconductor devices which can include, in particular, a processor, a memory and an interface circuit connected to the circuit board 206 of the probe card 109. The memory may store a program for performing the methods described above that is executable by the processor. The automatic test equipment may also be adapted to control the actuator 301 of the shutter 104 for moving the shutter 104 between the open position and the closed position. In particular, the automatic test equipment 107 may be adapted to supply electric signals for operating the actuator 301 to the actuator 301. For this purpose, the interface circuit may be connected to the actuator 301, for example via electrically conductive lines on the circuit board 206.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
a probe card comprising a plurality of contact elements, said contact elements defining a measuring position;
an alpha particle source; and
a shutter arranged between said alpha particle source and said measuring position, said shutter being movable between a closed position and an open position, wherein alpha particles from said alpha particle source reach said measuring position when said shutter is in said open position and said alpha particles are blocked from reaching said measuring position when said shutter is in said closed position, wherein said alpha particle source comprises a radioactive material emitting both alpha particles and gamma radiation, and wherein said apparatus further comprises automatic test equipment configured to calculate an intensity of alpha particles obtained in an irradiation area located at said measuring position when said shutter is in said open position based on a spectroscopic measurement of an intensity of said gamma radiation emitted by said radioactive material.

2. The apparatus of claim 1, further comprising a wafer holder receiving a wafer comprising a semiconductor device and holding said semiconductor device at said measuring position, wherein said plurality of contact elements provide an electrical connection to said semiconductor device when said semiconductor device is at said measuring position.

3. The apparatus of claim 2, wherein said shutter comprises an actuator moving said shutter between said open position and said closed position.

4. The apparatus of claim 3, said automatic test equipment operating said actuator of said shutter and being connected to said plurality of contact elements, wherein said automatic test equipment automatically performs one or more tests of said semiconductor device when said semiconductor device is at said measuring position and operates said actuator to maintain said shutter in said open position during at least a part of at least one of said one or more tests.

5. The apparatus of claim 4, wherein said one or more tests comprise a measurement of alpha ray induced soft errors in said semiconductor device and said automatic test equipment operates said actuator to maintain said shutter in said open position during at least a part of said measurement of alpha ray induced soft errors.

6. The apparatus of claim 5, wherein said one or more tests further comprise a test of said semiconductor device for functional defects and said automatic test equipment operates said actuator to maintain said shutter in said closed position during said test of said semiconductor device for functional defects.

7. The apparatus of claim 1, further comprising an adjuster modifying a distance between said alpha particle source and said measuring position.

8. The apparatus of claim 1, wherein said shutter comprises a leaf shutter.

9. The apparatus of claim 6, wherein the apparatus further comprises an adjuster modifying a distance between said alpha particle source and said measuring position, wherein each of said plurality of contact elements comprises a needle having a tip arranged at a perimeter of said irradiation area, each of said needles extending away from said irradiation area, and wherein said shutter comprises a leaf shutter.

10. The apparatus of claim 1, wherein each of said plurality of contact elements comprises a needle having a tip arranged at a perimeter of said irradiation area, each of said needles extending away from said irradiation area.

11. A method, comprising:
providing an apparatus comprising a radioactive material providing an alpha particle source and a gamma radiation source and a shutter arranged between said alpha particle source and an irradiation area;
providing a wafer comprising a first semiconductor device;
positioning said wafer so that at least a part of said first semiconductor device is located in said irradiation area;
performing a first test of said first semiconductor device, wherein said shutter is maintained in a closed position during said first test;
performing a second test of said first semiconductor device, wherein said shutter is maintained in an open position during at least a part of said second test, wherein said shutter allows alpha particles to reach said first semiconductor device when said shutter is in said open position and blocks alpha particles from reaching said first semiconductor device when said shutter is in said closed position;
measuring an intensity of said gamma radiation emitted by said radioactive material; and
determining, by automatic test equipment of said apparatus, an intensity of alpha particles obtained in said irradiation area when said shutter is in said open position on the basis of the measured intensity of said gamma radiation.

12. The method of claim 11, wherein said first test comprises a test of said first semiconductor device for functional defects.

13. The method of claim 12, wherein said second test comprises a measurement of alpha ray induced soft errors in said first semiconductor device.

14. The method of claim 13, further comprising contacting each of a plurality of contact areas in said first semiconductor device with one of a plurality of contact elements, wherein each of said first and the second test comprises:
applying an electric input signal to said first semiconductor device through said plurality of contact elements and receiving an electric output signal from said first semiconductor device through said plurality of contact elements.

15. The method of claim 11, wherein said wafer further comprises a second semiconductor device and wherein the method further comprises:
positioning said wafer so that at least a part of said second semiconductor device is located in said irradiation area;
performing a first test of said second semiconductor device, wherein said shutter is maintained in said closed position during said first test; and
performing a second test of said second semiconductor device, wherein said shutter is maintained in said open position during at least a part of said second test.

16. The method of claim 11, further comprising adjusting a distance between said alpha particle source and said semiconductor device.

17. The method of claim 11, wherein said shutter comprises an actuator moving said shutter between said open position and said closed position, and wherein the method comprises operating said actuator to maintain said shutter in said closed position during said first test and to maintain said shutter in said open position during said second test.

18. The method of claim 11, further comprising: forming at least one material layer over said wafer after performing said first and said second test.

19. The method of claim 18, wherein one or more backend layers are formed over said wafer, each backend layer comprising a plurality of electrically conductive lines formed in a layer of an electrically insulating material.

20. The method of claim 11, wherein said wafer further comprises a plurality of second semiconductor devices, and wherein for each of said second semiconductor devices, said wafer is positioned so that at least a part of the respective second semiconductor device is located in said irradiation area, said first test of the respective second semiconductor device is performed, wherein said shutter is maintained in said closed position during said first test, and said second test of the respective second semiconductor device is performed, wherein said shutter is maintained in said open position during at least a part of said second test.

* * * * *